(12) United States Patent
Zhao et al.

(10) Patent No.: US 6,614,291 B1
(45) Date of Patent: Sep. 2, 2003

(54) LOW VOLTAGE, HIGH SPEED CMOS CML LATCH AND MUX DEVICES

(75) Inventors: Ji Zhao, San Jose, CA (US); Kochung Lee, Sunnyvale, CA (US); Edwin Chan, San Jose, CA (US)

(73) Assignee: Lattice Semiconductor Corp., Hillsboro, OR (US)

( * ) Notice: Subject to any disclaimer, the term of this patent is extended or adjusted under 35 U.S.C. 154(b) by 0 days.

(21) Appl. No.: 09/881,950

(22) Filed: Jun. 15, 2001

(51) Int. Cl.[7] ............................................. H03K 17/62
(52) U.S. Cl. ..................... 327/408; 327/99; 327/538; 326/115
(58) Field of Search ...................... 327/99, 407, 408, 327/410, 411, 413, 404, 530, 538, 543, 266, 274, 280; 326/115, 122, 125, 129, 112

(56) References Cited

U.S. PATENT DOCUMENTS

| | | | | |
|---|---|---|---|---|
| 4,031,506 A | * | 6/1977 | Siems | 367/45 |
| 5,182,467 A | * | 1/1993 | Taylor et al. | 327/175 |
| 6,188,339 B1 | * | 2/2001 | Hasegawa | 326/115 |
| 6,211,722 B1 | * | 4/2001 | Mattia et al. | 327/407 |
| 6,310,509 B1 | * | 10/2001 | Davenport et al. | 327/407 |

* cited by examiner

*Primary Examiner*—Minh Nguyen

(57) ABSTRACT

A signal multiplexer system and a signal latch system for low voltage ($V_{dd} \approx 1.2$ volts) and high speed transitions between states. A dc signal isolation circuit, inserted between a clock signal circuit and a signal input/output circuit, allows use of a two-transistor-layer vertical structure that provides adequate headroom voltage (about 0.3–0.4 volts, or larger) for high speed transistor response.

6 Claims, 4 Drawing Sheets

LOW VOLTAGE, HIGH SPEED CMOS CML LATCH AND MUX DEVICES

FIELD OF THE INVENTION

This invention relates to electrical circuits for high speed latches and multiplexers that use relatively low voltages.

BACKGROUND OF THE INVENTION

CMOS CML designs for latches and multiplexers (MUXes) ARE widely used in VLSI chip design, due to the high switching speeds available with such designs. Conventional CMOS CML latch and MUX designs use three-layer staggered transistors involving a current source transistor, a switch transistor and a differential transistor pair, plus a resistive load. Advanced CMOS technology provides high switching speed capability, if sufficient voltage headroom is available to drive the transistors from a first state to a second state. However, the low voltage supply, as low as 1.2 volts for 0.13 µm deep sub-micron technology, associated with state-of-the-art CMOS technology severely limits the use of conventional three-layer staggered transistor designs, unless the headroom can be increased. Where only 1.2 v is available, top to bottom, to drive a system, a conventional approach provides headroom of only about 0.2 v, which produces a sluggish response from a CMOS transistor. The response often forces the transistor to operate in the linear region, rather than in the saturated region where high(er) switching speed is available.

A conventional approach to this problem is to continue using a three-layer staggered transistor configuration, but with lowered threshold voltage $V_{th}$, and to optimize the circuit to attempt to coax another tenth of a volt out of the system to add to the (anemic) headroom. This is not a satisfactory solution, for at least two reasons. First, the extra tenth of a volt, added to headroom, does not fully restore operation of the transistor configuration in the saturation region. Second, use of a lowered threshold voltage carries with it some problems of increased instability and uncertainty in control of the circuit.

What is needed is a different approach that provides adequate headroom, preferably at least 0.3–0.5 v, without reducing voltage threshold and without wholesale modification of the latch or MUX circuit. Preferably, the approach should be flexible enough to be usable in other related circuits as well.

SUMMARY OF THE INVENTION

These needs are met by the invention, which provides an approach that reduces the additive dc voltage associated with a multi-layer staggered transistor configuration and converts a three-layer structure to what is effectively a two-layer structure for purposes of providing headroom. The system includes at least one pair of capacitors, strategically placed to isolate a dc bias associated with a transistor pair and to thereby provide additional headroom of 0.3–0.4 v to drive a transistor configuration into saturation for high speed switching.

BRIEF DESCRIPTION OF THE INVENTION

Figure 1:
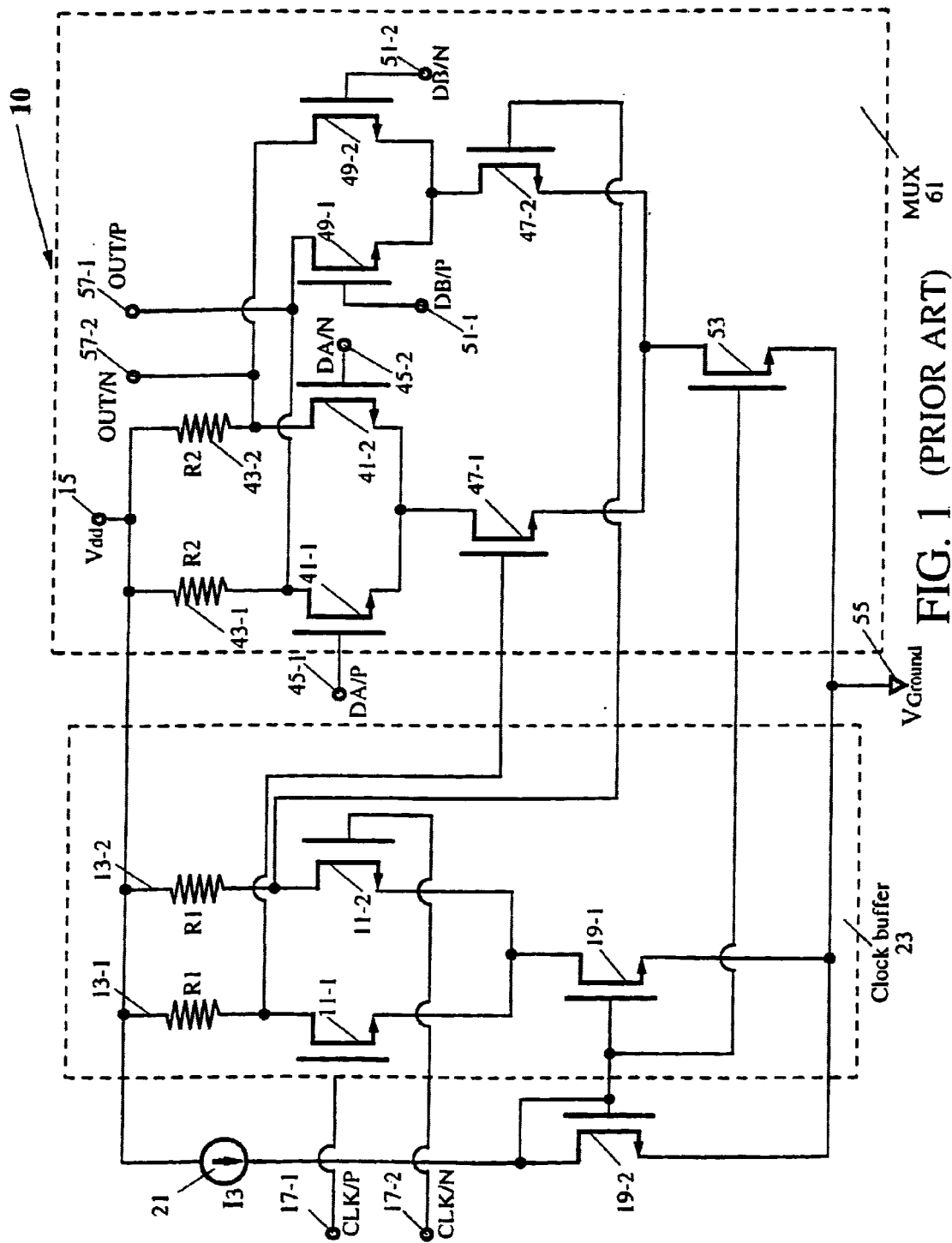
Figure 3:
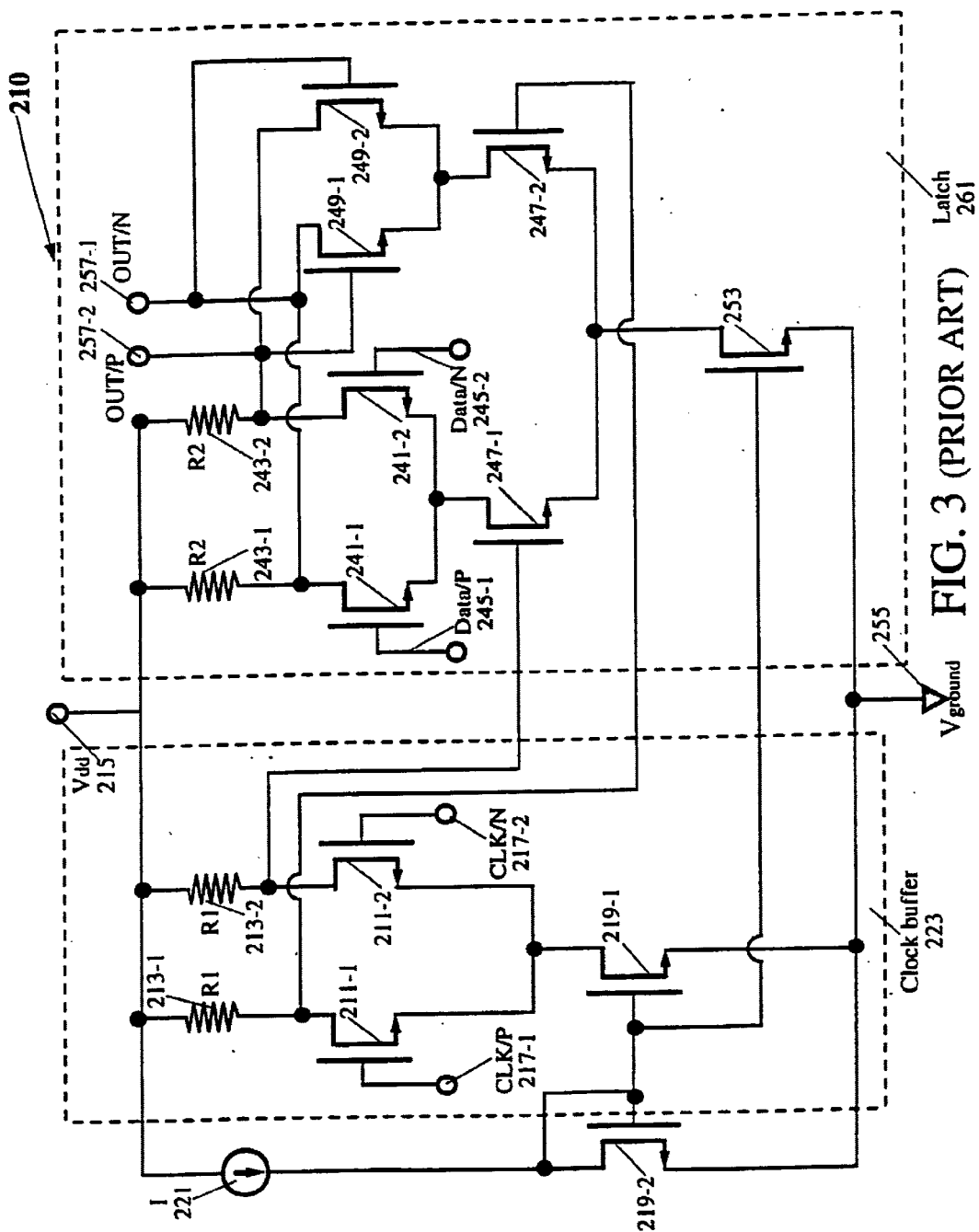

FIGS. 1 and 3 schematically illustrate conventional circuits used for high speed switching in a MUX and in a latch, respectively.

Figure 2:
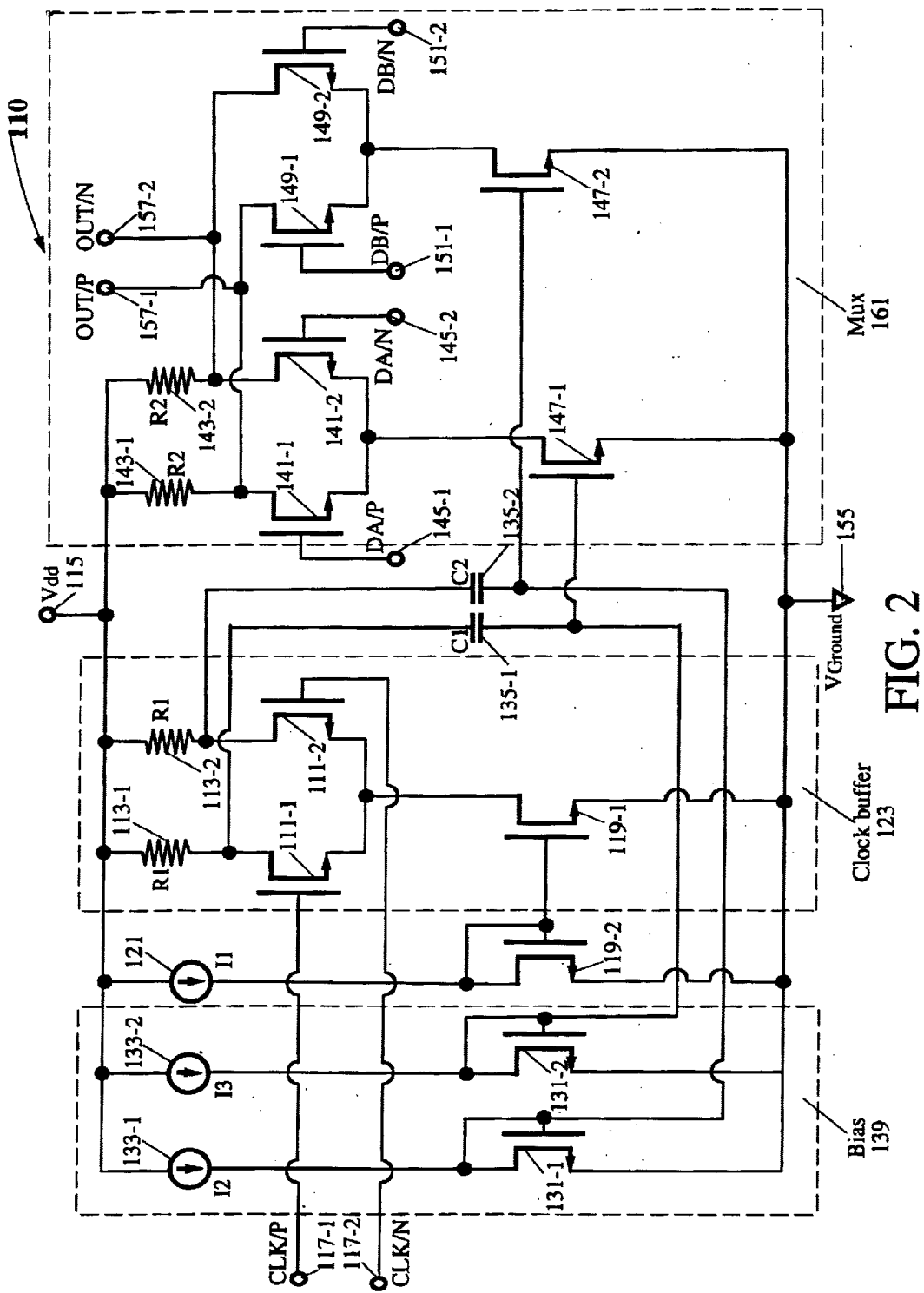
Figure 4:
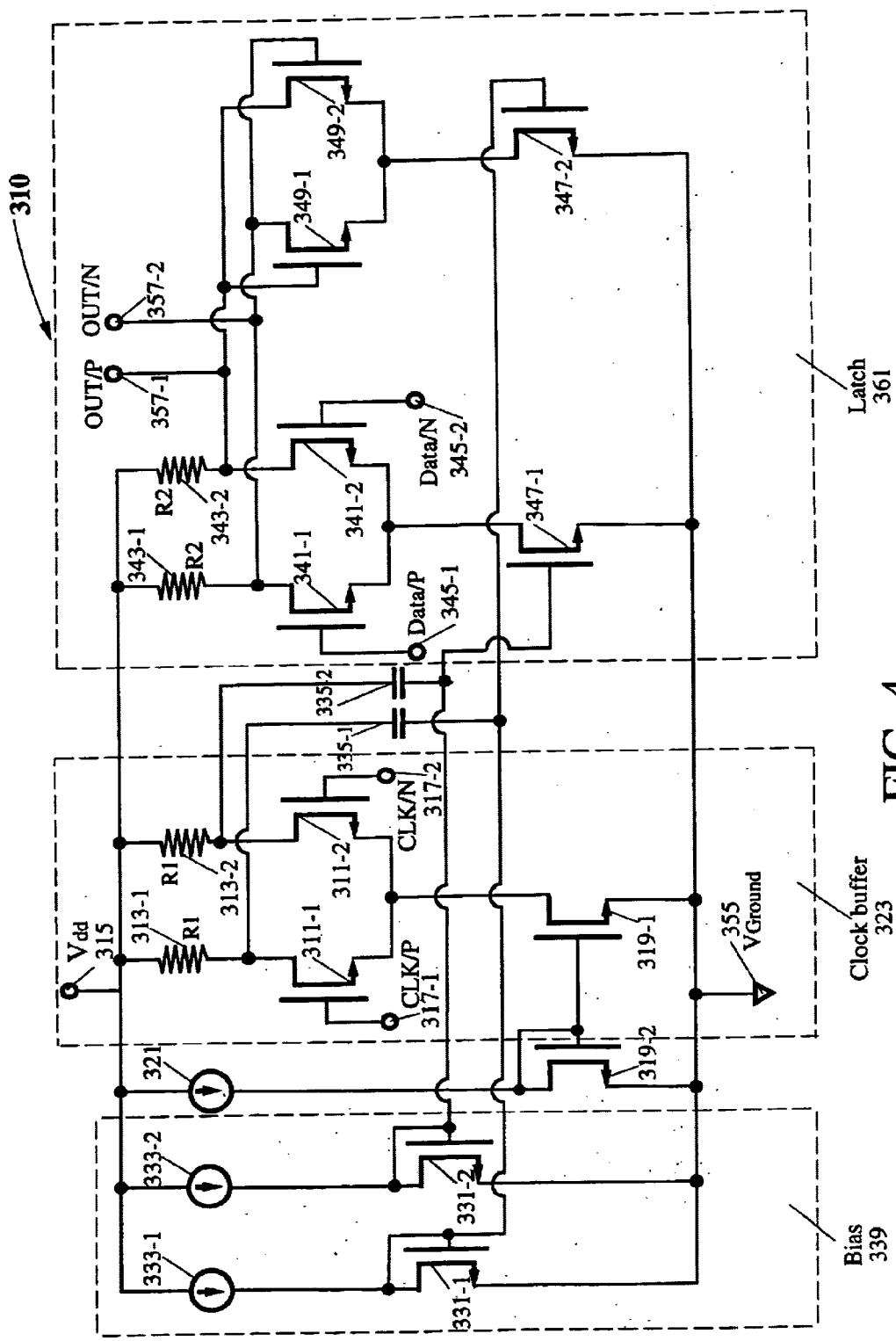

FIGS. 2 and 4 schematically illustrate circuits that are constructed according to the invention to provide high speed switching in a MUX and in a latch, respectively.

DESCRIPTION OF BEST MODES OF THE INVENTION

FIG. 1 schematically illustrates a representative MUX 10 based on CMOS CML design in a conventional approach. Drains of first and second NMOS transistors, 11-1 and 11-2, are connected across respective matched first and second resistors 13-1 and 13-2 (each having a selected resistance R1) to a voltage source 15 having a selected voltage $V_{dd}$. Gates of the first and second transistors, 11-1 and 11-2, are connected to respective clock input terminals, 17-1 and 17-2, that provide complementary clock input signals, CLK/P and CLK/N, respectively. When a first clock input signal CLK/P is high, the first transistor 11-1 is conducting, the second clock input signal CLK/N is low, and the second transistor 11-2 is non-conducting, and inversely.

Sources of the first and second transistors, 11-1 and 11-2, are connected to the drain of a third NMOS transistor 19-1. Gates of the third transistor 19-1 and of a fourth NMOS transistor 19-2 are connected together and to a first terminal of a current source 21, whose second terminal is connected to the selected voltage source 15. The sources of the third and fourth transistors, 19-1 and 19-2, are connected to a source of ground voltage ($V_G$) 55. The first, second, third and fourth transistors, 11-1, 11-2, 19-1 and 19-2, and the first and second resistors, 13-1 and 13-2, are part of a clock buffer module 23.

Drains of fifth and sixth NMOS transistors, 41-1 and 41-2, are connected through respective third and fourth resistors, 43-1 and 43-2, to the selected voltage source 15. Gates of the fifth and sixth transistors, 41-1 and 41-2, are connected to respective first and second input signal terminals, 45-1 and 45-2, that receive data input signals, DA/P and DA/N, respectively, to be multiplexed. Sources of the fifth and sixth transistors, 41-1 and 41-2, are connected together and to a drain of a seventh NMOS transistor 47-1, whose source is connected to a source of an eighth NMOS transistor 47-2.

Drains of ninth and tenth NMOS transistors, 49-1 and 49-2, are connected through the respective third and fourth resistors, 43-1 and 43-2, to the selected voltage source 15. Gates of the ninth and tenth transistors, 49-1 and 49-2, are connected to respective third and fourth input signal terminals, 51-1 and 51-2, that receive data input signals, DB/P and DB/N, respectively, to be multiplexed. Sources of the ninth and tenth transistors, 49-1 and 49-2, are connected to a drain of the eighth NMOS transistor 47-2.

The sources of the seventh and eighth transistors, 47-1 and 47-2, are connected to a drain of an eleventh NMOS transistor 53, whose gate is connected to the gates of the third and fourth transistors, 19-1 and 19-2, and whose source is connected to the ground voltage source 55.

The drains of the fifth and ninth transistors, 41-1 and 49-1, are connected to a first output signal terminal, 57-1 that provides an output signal, OUT/P=DA/P or DB/P, to be multiplexed. The drains of the sixth and tenth transistors, 41-2 and 49-2, are connected to a second output signal terminal, 57-2 that provides an output signal, OUT/N=DA/N or DB/N, to be multiplexed.

As the complementary clock signals, CLK/P and CLK/N, received at the clock input terminals, 17-1 and 17-2, go high and go low: (1) the first and second transistors, 11-1 and 11-2, become correspondingly conducting and nonoconducting; and (2) the seventh and eight transistors, 47-1 and 47-2, become correspondingly conducting and non-conducting.

The output signals, OUT/P and OUT/N, at the first output terminal 57-1 and second output terminal 57-2 follow inversions of the high (or low) input signals, DA/P and DA/N, received at the first and second input signal terminals, 45-1 and 45-2, when the seventh transistor 47-1 is in a conducting state. The output signals, OUT/P and OUT/N, at the first output terminal 57-1 and second output terminal 57-2 follow inversions of the high (or low) input signals, DB/P and DB/N, received at the third and fourth input signal terminals, 51-1 and 51-2, when the eighth transistor 47-2 is in a conducting state.

This state of affairs requires, for example, that the selected voltage $V_{dd}$ be greater than the sum of the voltage drops across the fifth transistor 41-1, the seventh transistor 47-1 and the eleventh transistor 53; that is, that the headroom voltage $V_{head} = V_{dd} - 3 \cdot \Delta V$, with $\Delta V \approx 0.4$ v, be sufficiently large (at least 0.3–0.4 v) to drive an NMOS transistor from a first saturation state to a second saturation state in a very short time interval (e.g., in less than 1 nsec). In an MOS transistor, switching from a first state (e.g., non-conducting) to a second state (e.g., conducting) occurs by driving substantially all free charge carriers of a first type (e.g., holes) from a transition region and replacing these first type free charge carriers by either no charge carriers or by free charge carriers of a second type (e.g., electrons) in a short time interval If the headroom voltage $V_{head}$ is positive but relatively small, switching can occur, but over a larger time interval, and the benefits of fast switching are lost.

Where three transistors appear in a connected, vertical configuration, this fast switching requirement requires that the selected voltage $V_{dd}$ be at least 1.5–1.6 v. However, deep sub-micron integrated semiconductor device construction often requires use of smaller voltages, such as $V_{dd}=1.2$ v, which voltage is clearly insufficient to provide fast switching, using the MUX configuration 10 shown in FIG. 1.

FIG. 2 illustrates schematically a MUX device 110 constructed according to the invention. Drains of first and second NMOS transistors, 11-1 and 11-2, are connected across respective matched first and second resistors 113-1 and 113-2 (each having a selected resistance R1) to a voltage source 115 having a selected voltage $V_{dd}$. Gates of the first and second transistors, 111-1 and 111-2, are connected to respective clock input terminals, 117-1 and 117-2, that provide complementary clock input signals, CLK/P and CLK/N, respectively. When a first clock input signal CLK/P is high, the first transistor 111-1 is conducting, the second clock input signal CLK/N is low, and the second transistor 111-2 is nonconducting, and inversely.

Sources of the first and second transistors, 111-1 and 111-2, are connected to the drain of a third NMOS transistor 119-1. Gates of the third transistor 119-1 and of a fourth NMOS transistor 119-2 are connected to a first terminal of a first current source 121, whose second terminal is connected to the selected voltage source 115. Sources of the third and fourth transistors, 119-1 and 119-2, are connected to a source of ground voltage ($V_G$) 155. The first, second, third and fourth transistors, 111-1, 111-2, 119-1 and 119-2, and the first and second resistors, 113-1 and 113-2, are part of a clock buffer module 123.

Drains of fifth and sixth NMOS transistors, 141-1 and 141-2, are connected through respective third and fourth resistors, 143-1 and 143-2, to the selected voltage source 115. Gates of the fifth and sixth transistors, 141-1 and 141-2, are connected to respective first and second input signal terminals, 145-1 and 145-2, that receive data input signals, DA/P and DA/N, respectively, to be multiplexed. Sources of the fifth and sixth transistors, 141-1 and 141-2, are connected to a drain of a seventh NMOS transistor 147-1, whose source is connected to a source of an eighth NMOS transistor 147-2 and to the ground voltage source 155.

Drains of ninth and tenth NMOS transistors, 149-1 and 149-2, are connected through the respective third and fourth resistors, 143-1 and 143-2, to the voltage source 115. Gates of the ninth and tenth transistors, 149-1 and 149-2, are connected to respective third and fourth input signal terminals, 151-1 and 15 1-2, that receive data input signals, DB/P and DB/N, respectively, to be multiplexed. Sources of the ninth and tenth transistors, 149-1 and 149-2, are connected to a drain of the eighth NMOS transistor 147-2. Sources of the seventh and eighth transistors, 147-1 and 147-2, are connected to the ground voltage source 55. The seventh and eighth transistors, 147-1 and 147-2, serve as a switch transistor pair to activate at most one of the transistor pairs, 141-1/141-2 and 149-1/149-2.

The fifth and sixth transistors, 141-1 and 141-2, and also the ninth and tenth transistors, 149-1 and 149-2, serve as differential transistor pairs for the output signal terminals, 157-1 and 157-2.

The output signals, OUT/P and OUT/N, at the first output terminal 157-1 and second output terminal 157-2 follow inversions of the high (or low) input signals, DA/P and DA/N, received at the first and second input signal terminals, 145-1 and 145-2, when the seventh transistor 147-1 is in a conducting state. The output signals, OUT/P and OUT/N, at the first output terminal 157-1 and second output terminal 157-2 follow inversions of the high (or low) input signals, DB/P and DB/N, received at the third and fourth input signal terminals, 151-1 and 151-2, when the eighth transistor 147-2 is in a conducting state.

The fifth, sixth, seventh, eighth, ninth and tenth transistors, 141-1, 141-2, 147-1, 147-2, 149-1 and 149-2, and the third and fourth resistors, 143-1 and 143-2, are part of a MUX module 161 of the MUX device 110 constructed according to the invention.

Drains of eleventh and twelfth transistors, 131-1 and 131-2, are connected to first terminals of respective second and third current sources, 133-1 and 133-2, whose second terminals are connected to the selected voltage source 115. Sources of the eleventh and twelfth transistors, 131-1 and 131-2, are connected to the ground voltage source 155. Gates of the eleventh and twelfth transistors, 131-1 and 131-2, are connected to the respective gates of the seventh and eighth transistors, 147-1 and 147-2, and are connected across respective first and second capacitors, 135-1 and 135-2, to the drains of the first and second-transistors, 111-1 and 111-2.

By positioning the first and second capacitors, 135-1 and 135-2, as shown in FIG. 2, the dc components of the source voltages of the first and second transistors, 111-1 and 111-2, are effectively isolated from the constraints imposed by most other components of the MUX device 110. Further, the MUX module 161 is now a two-transistor layer structure (e.g., 141-1 and 147-1), for purposes of headroom voltage constraints. The headroom voltage becomes $V_{head} = V_{dd} - 2 \cdot \Delta V = 0.4$ v, if the selected voltage $V_{dd}$ is 1.2 v, and this headroom voltage is sufficient to drive transistors within the MUX device 110 from a first saturation state to a second saturation state in a short time interval.

The eleventh and twelfth transistors, 131-1 and 131-2, and the second and third current sources, 133-1 and 133-2, are part of a voltage bias module 139 of the MUX device 110.

FIG. 3 schematically illustrates a representative MUX 210 based on CMOS CML design in a conventional approach. Drains of first and second NMOS transistors, 211-1 and 211-2, are connected across respective matched first and second resistors 213-1 and 213-2 (each having a selected resistance R1) to a voltage source 215 having a selected voltage $V_{dd}$. Gates of the first and second transistors, 211-1 and 211-2, are connected to respective clock input terminals, 217-1 and 217-2, that provide complementary clock input signals, CLK/P and CLK/N, respectively. When a first clock input signal CLK/P is high, the first transistor 211-1 is conducting, the second clock input signal CLK/N is low, and the second transistor 211-2 is non-conducting, and inversely.

Sources of the first and second transistors, 211-1 and 211-2, are connected to the drain of a third NMOS transistor 219-1. Drain and gate of the third transistor 219-1 and gate of a fourth NMOS transistor 219-2 are connected to a first terminal of a current source 221, whose second terminal is connected to the selected voltage source 215. Sources of the third and fourth transistors, 219-1 and 219-2, are connected to a source of ground voltage ($V_G$) 255. The first, second, third and fourth transistors, 211-1, 211-2, 219-1 and 219-2, and the first and second resistors, 213-1 and 213-2, are part of a clock buffer module 223.

Drains of fifth and sixth NMOS transistors, 241-1 and 241-2, are connected through respective third and fourth resistors, 243-1 and 243-2, to the selected voltage source 215. Gates of the fifth and sixth transistors, 241-1 and 241-2, are connected to respective first and second data input signal terminals, 245-1 and 245-2, respectively, that receive input signals, Data/P and Data/N, respectively. Sources of the fifth and sixth transistors, 241-1 and 241-2, are connected to a drain of a seventh NMOS transistor 247-1, whose source is connected to a source of an eighth NMOS transistor 247-2.

Drains of ninth and tenth NMOS transistors, 249-1 and 249-2, are connected through the respective third and fourth resistors, 243-2 and 243-1, to the selected voltage source 215. The drain of the ninth transistor 249-1 and the gate of the tenth transistor 249-2 are connected to the drain of the fifth transistor 241-1, and to a first data output terminal 257-1 that provides a first latched data output signal OUT/N. The drain of the tenth transistor 249-2 and the gate of the ninth transistor 249-1 are connected to the drain of the sixth transistor 241-2, and to a second data output terminal 257-2 that provides a second latched data output signal OUT/P. The drains of the fifth and sixth transistors, 241-1 and 241-2, follow inversions of the data input signals, Data/P and Data/N, respectively, when the seventh transistor 247-1 is in a conducting state.

The sources of the seventh and eighth transistors, 247-1 and 247-2, are connected to a drain of an eleventh NMOS transistor 253, whose gate is connected to the gates of the third and fourth transistors, 219-1 and 219-2, and whose source is connected to the ground voltage source 255.

The fifth, sixth, seventh, eighth, ninth, tenth and eleventh transistors, 241-1, 241-2, 247-1, 247-2, 249-1, 249-2 and 253, the third and fourth resistors, 243-1 and 243-2, the first and second data input terminals, 245-1 and 245-2, and the first and second data output terminals, 257-1 and 257-2, are part of a latch module 261 that is part of the latch device 210.

Where three transistors, such as 241-1, 247-1 and 253 in FIG. 3, appear in a connected, vertical configuration, this fast switching requirement requires that the selected voltage $V_{dd}$ be at least 1.5–1.6, as discussed in connection with FIG. 1. However, deep sub-micron integrated semiconductor device construction often requires use of smaller voltages, such as $V_{dd}=1.2$ v, which voltage is clearly insufficient to provide fast switching, using the latch configuration 210 shown in FIG. 3.

FIG. 4 illustrates schematically a latch device 310 constructed according to the invention. Drains of first and second NMOS transistors, 311-1 and 311-2, are connected across respective matched first and second resistors 313-1 and 313-2 to a voltage source 315 having a selected voltage $V_{dd}$. Gates of the first and second transistors, 311-1 and 311-2, are connected to respective clock input terminals, 317-1 and 317-2, that provide complementary clock input signals, CLK/P and CLK/N, respectively. When a first clock input signal CLK/P is high, the first transistor 311-1 is conducting, the second clock input signal CLK/N is low, and the second transistor 311-2 is non-conducting, and inversely.

Sources of the first and second transistors, 311-1 and 311-2, are connected to a drain of a third NMOS transistor 319-1. A gate of the third transistor 319-1 and a drain and gate of a fourth NMOS transistor 319-2 are connected to a first terminal of a first current source 321, whose second terminal is connected to the selected voltage source 315. Sources of the third and fourth transistors, 319-1 and 319-2, are connected to a source of ground voltage ($V_G$) 355. The first, second, third and fourth transistors, 311-1, 311-2, 319-1 and 319-2, and the first and second resistors, 313-1 and 313-2, are part of a clock buffer module 323.

Drains of fifth and sixth NMOS transistors, 341-1 and 341-2, are connected through respective third and fourth resistors, 343-1 and 343-2, to the selected voltage source 315. Gates of the fifth and sixth transistors, 341-1 and 341-2, are connected to respective input signal terminals, 345-1 and 345-2, that receive and latch data input signals, Data/P and Data/N, respectively. Sources of the fifth and sixth transistors, 341-1 and 341-2, are connected to a drain of a seventh NMOS transistor 347-1, whose source is connected to a source of an eighth NMOS transistor 347-2 and to the ground voltage source 355. The seventh and eighth transistors, 347-1 and 347-2, serve as a switch transistor pair to activate at most one of the transistor pairs, 341-1/341-2 and 349-1/349-2.

The drain of the ninth transistor 349-1 and the gate of the tenth transistor 349-2 are connected to the drain of the fifth transistor 341-1, and to a first data output terminal 357-1. The drain of the tenth transistor 349-2 and the gate of the ninth transistor 349-1 are connected to the drain of the sixth transistor 341-2, and to a second data output terminal 357-2. Drains of the fifth and sixth transistors, 341-1 and 341-2, follow inversions of the data input signals, Data/P and Data/N, respectively, when the seventh transistor 347-1 is in a conducting state.

The fifth, sixth, seventh, eighth, ninth and tenth transistors, 341-1, 341-2, 347-1, 347-2, 349-1 and 349-2, the third and fourth resistors, 343-1 and 343-2, the first and second data input terminals, 345-1 and 345-2, and the first and second data output terminals, 357-1 and 357-2, are part of a latch module 361 of the latch device 310 constructed according to the invention.

Drains of eleventh and twelfth transistors, 331-1 and 331-2, are connected to first terminals of respective second and third current sources, 333-1 and 333-2, whose second terminals are connected to the selected voltage source 315. Sources of the eleventh and twelfth transistors, 331-1 and 331-2, are connected to the ground voltage source 355. A gate of the eleventh transistor 331-1 is connected across a first capacitor 335-1 to the drain of the first transistor 311-1 and to a gate of the eighth transistor 347-2. A gate of the twelfth transistor 331-2 is connected across a second capacitor 335-2 to the drain of the second transistor 311-2 and to a gate of the seventh transistor 347-1.

By positioning the first and second capacitors, 335-1 and 335-2, as shown in FIG. 4, the dc components of the source voltages of the first and second transistors, 311-1 and 311-2, are effectively isolated from the constraints imposed by most other components of the latch device 310. Further, the latch module 361 is now a two-layer transistor structure (e.g., 341-1 and 347-1), for purposes of headroom voltage constraints. The headroom voltage becomes $V_{head}=V_{dd}-2 \cdot \Delta V =0.4$ v, if the selected voltage $V_{dd}$ is 1.2 v, and this headroom voltage is sufficient to drive transistors within the latch device 310 from a first saturation state to a second saturation state in a short time interval.

The eleventh and twelfth transistors, 331-1 and 331-2, and the second and third current sources, 333-1 and 333-2, are part of a voltage bias module 339 of the latch device 310.

The capacitors, 135-1 and 135-2, shown in FIG. 2 and the capacitors, 335-1 and 335-2, shown in FIG. 4 can be replaced by other dc signal isolation circuits that will provide dc signal isolation between the clock buffer circuits (123 and 323 in FIGS. 2 and 4) and the MUX and latch modules (161 and 361 in FIGS. 2 and 4), or that will otherwise allow use of two-transistor-layer vertical structures within the MUX module 161 and the latch module 361.

What is claimed is:

1. A multiplexer system comprising:
    a multiplexer circuit including:
        a first pair of source-coupled metal oxide semiconductor field effect transistors (MOSFETs) connected at their gates to a first pair of data input terminals, at their sources to a first switching MOSFET, and at their drains to a pair of data output terminals; and
        a second pair of source-coupled MOSFETs connected at their gates to a second pair of data input terminals, at their sources to a second switching MOSFET, and at their drains to the pair of data output terminals;
    a clock buffer circuit coupled to the multiplexer circuit and operable to generate a first buffered clock signal applied to the gate of the first switching MOSFET and a second buffered clock signal applied to the gate of the second switching MOSFET;
    a capacitor circuit coupled between the clock buffer circuit and multiplexer circuit to block the DC component of each buffered clock signal; and
    a voltage bias circuit coupled to the multiplexer circuit and operable to supply a constant voltage bias to the gates of the first and second switching MOSFETs.

2. The multiplexer system of claim 1 wherein the clock buffer circuit comprises a pair of source-coupled MOSFETs connected at their gates to a pair of clock input terminals and at their drains through resistors to a voltage supply, the drains further connected through capacitors of the capacitor circuit to the gates of the switching MOSFETs of the multiplexer system.

3. The multiplexer system of claim 1 wherein the voltage bias circuit comprises a pair of MOSFETS connected in diode configuration, the gates of the MOSFETs connected respectively to the gates of the first and second switching MOSFETS.

4. A latch system comprising:
    a latch circuit including:
        a first pair of source coupled metal oxide semiconductor field effect transistors (MOSFETs) connected at their gates to a pair of data input terminals, at their sources to a first switching MOSFET, and at their drains to a pair of data output terminals; and
        a second pair of source-coupled MOSFETs connected at their gates to the pair of data output terminals, at their sources to a second switching MOSFET, and at their drains to the pair of data output terminals, with the drain of the first MOSFET of the pair and the gate of the second MOSFET of the pair tied to one data output terminal and the gate of first MOSFET of the pair and the drain of the second MOSFET of the pair tied to the other data output terminal;
    a clock buffer circuit coupled to the latch circuit and operable to generate a first buffered clock signal applied to the gate of the first switching MOSFET and a second buffered clock signal applied to the gate of the second switching MOSFET;
    a capacitor circuit coupled between the clock buffer circuit and latch circuit to block the DC component of each buffered clock signal; and
    a voltage bias circuit coupled to the latch circuit and operable to supply a constant voltage bias to the gates of the first and second switching MOSFETs.

5. The latch system of claim 4 wherein the clock buffer circuit comprises a pair of source-coupled MOSFETs connected at their gates to a pair of clock input terminals and connected at their drains through resistors to a voltage supply, the drains further connected through capacitors of the capacitor circuit to the gates of the first and second switching MOSFETs of the latch system.

6. The latch system of claim 4 wherein the voltage bias circuit comprises a pair of MOSFETS connected in diode configuration, the gates of the MOSFETs connected respectively to the gates of the first and second switching MOSFETS of the latch system.

* * * * *